United States Patent
Wu

(10) Patent No.: US 8,556,318 B2
(45) Date of Patent: Oct. 15, 2013

(54) ELECTRIC-CONTROLLED OPERATOR

(75) Inventor: Lianghui Wu, Beijing (CN)

(73) Assignee: Semiconductor Manufacturing International (Beijing) Corporation (CN)

( * ) Notice: Subject to any disclaimer, the term of this patent is extended or adjusted under 35 U.S.C. 154(b) by 49 days.

(21) Appl. No.: 13/326,011

(22) Filed: Dec. 14, 2011

(65) Prior Publication Data

US 2013/0043696 A1 Feb. 21, 2013

(30) Foreign Application Priority Data

Aug. 16, 2011 (CN) .......................... 2011 1 0234386

(51) Int. Cl.
*B25J 15/10* (2006.01)

(52) U.S. Cl.
USPC .......... 294/207; 294/119.1; 294/907; 414/941

(58) Field of Classification Search
USPC .................. 294/207, 119.1, 213, 2, 87.1, 907; 414/226.01, 941; 901/32, 37, 38, 39
See application file for complete search history.

(56) References Cited

U.S. PATENT DOCUMENTS

| | | | | |
|---|---|---|---|---|
| 5,520,501 A | * | 5/1996 | Kouno et al. | 414/741 |
| 5,931,518 A | * | 8/1999 | Pirker | 294/119.1 |
| 6,062,241 A | * | 5/2000 | Tateyama et al. | 134/137 |
| 6,109,677 A | * | 8/2000 | Anthony | 294/103.1 |
| 6,454,332 B1 | * | 9/2002 | Govzman et al. | 294/185 |
| 6,837,672 B1 | * | 1/2005 | Tateyama et al. | 414/815 |
| 7,370,895 B2 | * | 5/2008 | Imai | 294/2 |
| 8,038,838 B2 | * | 10/2011 | Kim et al. | 156/345.55 |
| 2005/0110288 A1 | * | 5/2005 | Kern, Jr. | 294/2 |

* cited by examiner

*Primary Examiner* — Dean Kramer
(74) *Attorney, Agent, or Firm* — Innovation Counsel LLP

(57) ABSTRACT

An electric-controlled operator includes, in part, a first group of grippers and a second group of grippers which are coupled to a base. Grippers in the first group of grippers are adapted to cooperatively grip an object and cooperatively release the object. Grippers in the second group of grippers are adapted to cooperatively grip an object and cooperatively release the object. When the first (or the second) group of grippers cooperatively grips an object, the second (or the first) group of grippers is in a state in which the object is released. The first and second groups of grippers are adapted to put in and take out objects from the same surface of the base thus eliminating the need for turning of the base during the operation.

11 Claims, 5 Drawing Sheets

ELECTRIC-CONTROLLED OPERATOR

CROSS-REFERENCE TO RELATED APPLICATIONS

This application claims priority to Chinese Patent Application No. 201110234386.9, filed Aug. 16, 2011, which is incorporated herein by reference in its entirety.

BACKGROUND OF THE INVENTION

The present invention relates to an electric-controlled operator. More particularly, the present invention relates to an electric-controlled operator for gripping and releasing objects.

In semiconductor processing techniques, an electric-controlled operator is often used for gripping and releasing objects. For example, such an electric-controlled operator can be adapted to put an object into a process chamber, and to take out the processed object after the object has been processed in the process chamber.

An object before processing and the object after processing may have different properties (for example, different cleanliness, different coating, or the like). In order to prevent an object before processing and an object after processing from contaminating each other, an electric-controlled operator, as shown in FIG. 1a and FIG. 1b, has been used.

FIG. 1a is a schematic perspective view of an electric-controlled operator 100, as known in the prior art. The electric-controlled operator 100 has a base 110. The base 110 is coupled to a first group of grippers 101 and a second group of grippers 102. FIG. 1b is a cross-sectional view of operator 100 taken along line C-C' of FIG. 1a. As shown in FIG. 1a and FIG. 1b, the first group of grippers 101 is arranged to grip an object from a first surface 111 side of the base 110, while the second group of grippers 102 is arranged to grip an object from a second surface 112 side of the base 110, the second surface 112 is opposite to the first surface 111.

During the operation of the electric-controlled operator 100, the first group of grippers 101 is adapted to put an object into a process chamber. After the object has been processed in the process chamber, the base 110 is turned around (reversed) and then the second group of grippers 102 at the other side takes out the processed object. As such, the object before processing and the object after processing are put in and taken out respectively by different groups of grippers, preventing the object before processing and the object after processing from contaminating each other. The abovementioned object can be, for example, a wafer.

BRIEF SUMMARY OF THE INVENTION

However, according to the prior art shown in FIGS. 1a and 1b, for the processing in each process chamber, putting in objects and taking out objects respectively require the use of the first group of grippers 101 which performs putting in/taking out from the first surface 111 side and the use of the second group of grippers 102 which performs putting in/taking out from the second surface 112 side. Therefore, in order to alternately use the first group of grippers 101 and the second group of grippers 102, the base 110 needs to turn 180° frequently, and a motor (not shown) that is used to drive the base such that the base can turn also needs to operate frequently. As a result, the employed parts will be badly worn and have a reduced service life, and thus need to be replaced (exchanged) frequently.

The various embodiments of the present invention overcome the above-described problems.

According to a first aspect of the present invention, an electric-controlled operator is provided, which includes, in part: a base; a first group of grippers coupled to the base, said first group of grippers including at least three grippers, grippers in the first group of grippers being adapted to cooperatively grip an object and cooperatively release the object; a second group of grippers coupled to the base, said second group of grippers including at least three grippers, grippers in the second group of grippers being adapted to cooperatively grip an object and cooperatively release the object; wherein, the first group of grippers and second group of grippers are controlled individually, such that, when one of the first group of grippers and the second group of grippers cooperatively grips an object, the other one is in a state in which the object is released, and said first group of grippers and said second group of grippers are configured to grip the object from a same surface side of the base.

According to one embodiment, the grippers in the first group of grippers and the grippers in the second group of grippers can be alternately arranged on the base.

According to one embodiment, the grippers can be arranged around the base such that equal angles can be formed between adjacent grippers in the first group of grippers and equal angles can be formed between adjacent grippers in the second group of grippers.

According to one embodiment each one of the first group of grippers and said second group of grippers can be adapted to cooperatively grip the object by retracting and to cooperatively release the object by stretching out.

According to an implementation, each one of the grippers can be coupled to the base via a corresponding cylinder and can include a gripper arm connected to the cylinder. In addition, depending on a position of said gripper arm in the cylinder, the corresponding gripper can be in a retracting state or in a stretching out state.

According to one embodiment, the electric-controlled operator may further include a valve adapted to control the positions of the gripper arms in the cylinders; and a controller adapted to control the valve by using a control signal to control the positions of the gripper arms in the cylinders.

According to one embodiment, an elastic member can be connected between each gripper arm and the base.

According to one embodiment, the valve has a first passage and a second passage, with the first passage being used for controlling the positions of the gripper arms of the grippers of the first group of grippers in the cylinders, and the second passage being used for controlling the positions of the gripper arms of the grippers of the second group of grippers in the cylinders.

According to one embodiment, the valve can be a solenoid valve.

According to one embodiment, each of the grippers can have a gripper pin having a recess on the base side.

According to one embodiment, the electric-controlled operator may further include gripper arm position sensors, each of which corresponds to one gripper arm and is used for sensing the position of the gripper arm in the cylinder.

According to one embodiment, the electric-controlled operator may further include an alarm device capable of sending out an alarm signal when a position of a gripper arm in the cylinder that is sensed by said gripper arm position sensor is determined not to be consistent with an expected position of the gripper arm in the cylinder as set by said control signal.

According to one embodiment, the base may have a circular shape, the first group of grippers can include three grippers, the second group of grippers can include three grippers, and each one of said grippers can extend along a radial direction of said base. The object may be a wafer.

According to various embodiments of electric-controlled operator of the present invention, since both groups of grippers grip objects (put in and take out objects) from a same surface side of the base, putting in (and releasing) and taking out (an gripping) of the objects are performed on the same surface side of the base for each chamber, thus eliminating the necessity for the base to turn (reverse).

Furthermore, since the base does not need to turn (reverse), damage to parts such as the motor can be mitigated, thus avoiding frequent replacements of parts.

Further, according to some embodiments of the present invention, on the base of the electric-controlled operator, six grippers can be used.

Further features and advantages of the present invention will become apparent from the following detailed description of exemplary embodiments according to the present invention with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

In the drawings, the present invention is illustrated in an exemplary manner rather than a limiting manner. The present invention can be more clearly understood based on the following detailed description with reference to the accompanying drawings, in which:

FIG. 1b is a cross-sectional view taken along line C-C' of FIG. 1a.

DETAILED DESCRIPTION OF THE INVENTION

Figure 1A:
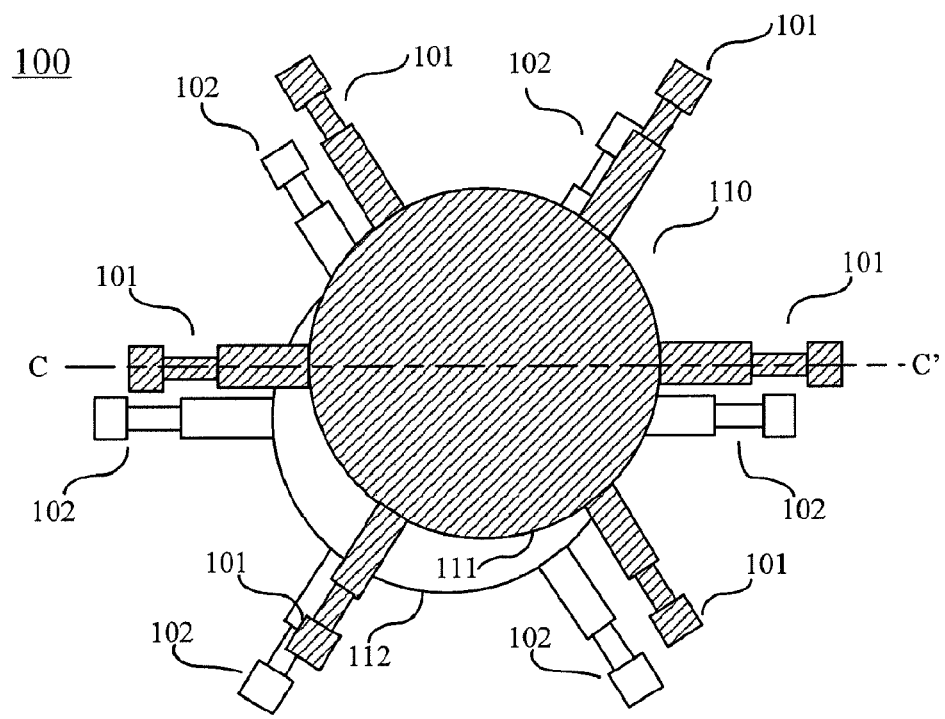
FIG. 1a is a schematic perspective view showing an electric-controlled operator of the prior art.
Figure 1B:
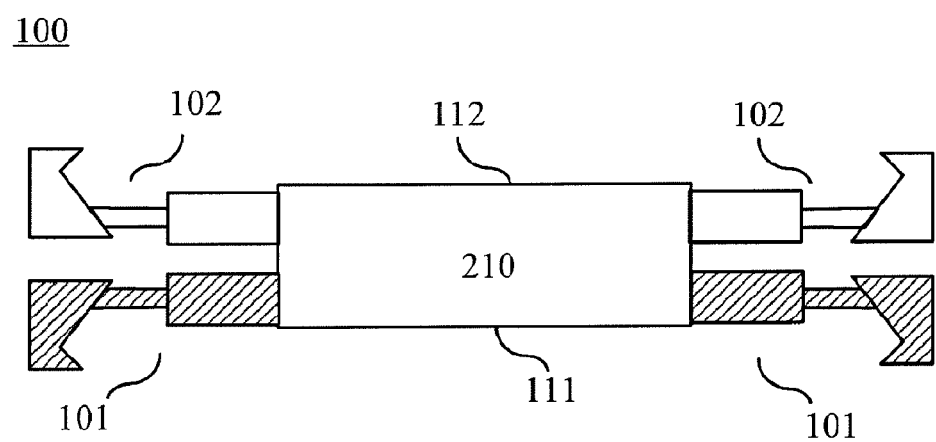

Various exemplary embodiments of the present disclosure will now be described in detail with reference to the drawings. It should be noted that the relative arrangement of the components and steps, the numerical expressions, and numerical values set forth in these embodiments do not limit the scope of the present invention unless it is expressively stated otherwise.

The following descriptions provide a thorough understanding of various embodiments of the present invention. For simplicity, structures and devices as well as their variants known to those skilled in the art are not described in detail below.

It is also understood that the components shown in the figures have not necessarily been drawn to scale.

The following description of at least one exemplary embodiment is merely illustrative in nature and is in no way intended to limit the invention, its application, or uses.

Techniques, methods and apparatus as known by one of ordinary skill in the relevant art may not be discussed in detail but should be deemed as part of the specification where appropriate.

In all of the examples illustrated and discussed herein, any specific values should be interpreted to be illustrative only and non-limiting. Thus, other examples of the exemplary embodiments could have different values.

Similar reference numerals and letters refer to similar items in the accompanying drawings, and thus once an item is defined in one figure, it may not be further discussed for the following figures.

In the present invention, terms "connect" and "communicate" not only include direct connection and direct communication, but also include connection and communication implemented via other components.

Figure 2:
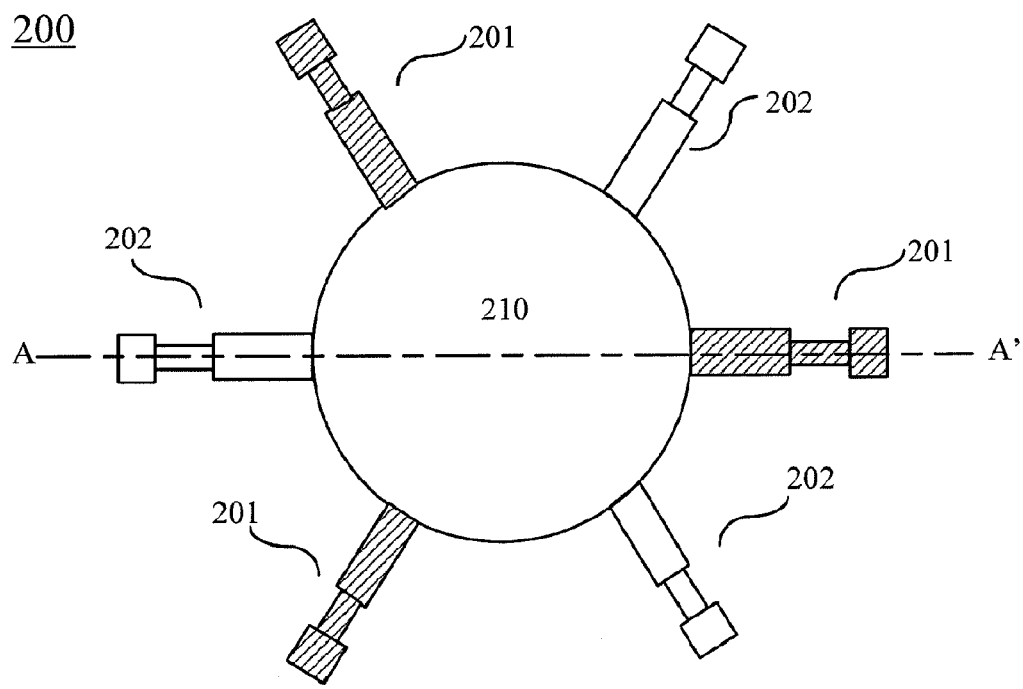
FIG. 2 is a schematic view showing an electric-controlled operator according to one embodiment of the present disclosure.

FIG. 2 is a schematic view of an electric-controlled operator 200 according to one embodiment of the present disclosure. As shown in FIG. 2, electric-controlled operator 200 has a base 210. The base 210 is coupled to a first group of grippers 201 and a second group of grippers 202. The first group of grippers 201 and the second group of grippers 202 can be arranged on substantially the same plane, but other variations are possible and the present invention is not limited to this.

During the operation of the electric-controlled operator 200, the first group of grippers 201 can be configured to cooperatively put an object into a process chamber, and after the object has been processed in the process chamber, the base 210 does not need to turn or reverse and the second group of grippers 202 cooperatively takes the processed object out. As such, the object before processing and the object after processing are put in and taken out respectively by different groups of grippers, thus preventing the object before processing and the object after processing from contaminating each other. The abovementioned object can be, for example, a wafer. The grippers of the groups of grippers can have a similar or the same structure.

More particularly, the first group of grippers 201 may include at least three grippers. The grippers of the first group of grippers 201 are adapted to cooperatively grip the object and cooperatively release the object. Similarly, the second group of grippers 202 may include at least three grippers. The grippers of the second group of grippers 202 are adapted to cooperatively grip the object and cooperatively release the object. Hereinto, the first group of grippers 201 and the second group of grippers 202 are controlled individually, such that, when one of the first group of grippers 201 and the second group of grippers 202 cooperatively grips the object, the other one is in a state in which the object is released (i.e. in a stretching-out state). It needs to be noted that, the first group of grippers 201 and the second group of grippers 202 according to the present invention are adapted to grip objects (i.e. put in and take out objects) from a same surface side of the base 210.

According to one implementation, the grippers can be arranged around the base. In order to more reliably grip the object, grippers in the first group of grippers 201 and grippers in the second group of grippers 202 can be alternately arranged on the base 210. However, depending on the properties of the object to be put and take as well as the shape of the grippers, other arrangements of the grippers can also be employed. For example, grippers in the first group of grippers can be arranged in succession, so do grippers in the second group of grippers.

In the example of the embodiment shown in FIG. 2, the base has a circular shape, and each of the grippers is arranged along the circumference of the base 210 and extends in a radial direction of the base 210. In one embodiment, adjacent grippers in the first group of grippers 201 can have equal angles therebetween, and adjacent grippers in the second group of grippers 202 can have equal angles therebetween. In the embodiment shown in FIG. 2 and where each group of grippers includes three grippers, the equal angle 120°. However, in some embodiments, adjacent grippers in each group of grippers many not have equal angles between them.

Figure 3:
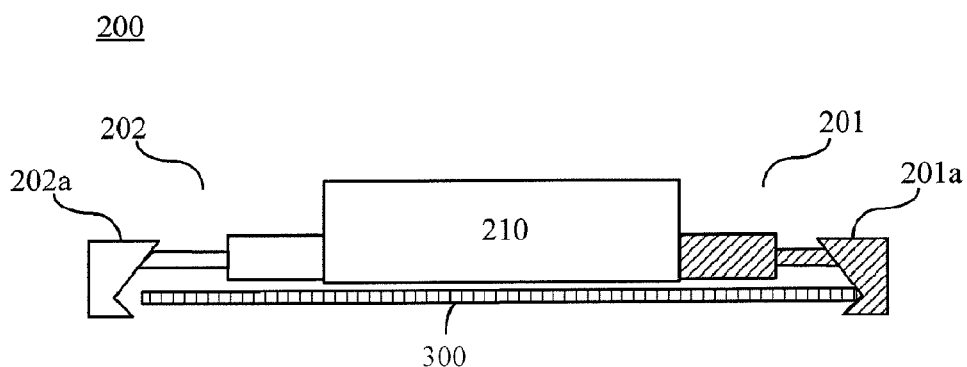
FIG. 3 is a cross-sectional view of the electric-controlled operator of FIG. 2, taken along line A-A'.

FIG. 3 is a cross-sectional view of operator 200 of FIG. 2 taken along line A-A' according to an exemplary implementation of the first embodiment.

As shown in FIG. 3, each gripper in the first group of grippers has a gripper pin 201$a$ and each gripper in the second group of grippers has a gripper pin 202$a$. Each of the gripper pins 201$a$ and 202$a$ has a recess on the side facing the base, which can be used for gripping the object, identified in FIG. 3 using reference numeral 300. Although the recess shown in FIG. 3 has a "V" shape, it may have a shape of an arc surface or a shape of a cylindrical surface, and the like, depending on the shape of the object to be gripped. FIG. 3 shows an example in which the first group of grippers 201 is gripping objects while the second group of grippers 202 is in a releasing state. In this example, the grippers in the first group of grippers 201 retract so as to cooperatively grip (hold) the object by locking the edge of the object, and the grippers in the second group of grippers 202 release so as not to contact the object.

Although only one gripper in the first group of grippers 201 and one gripper in the second group of grippers 202 are illustrated in the cross-sectional view of FIG. 3, it is understood that other grippers in each corresponding group of grippers can have a similar or same construction.

Figure 4:
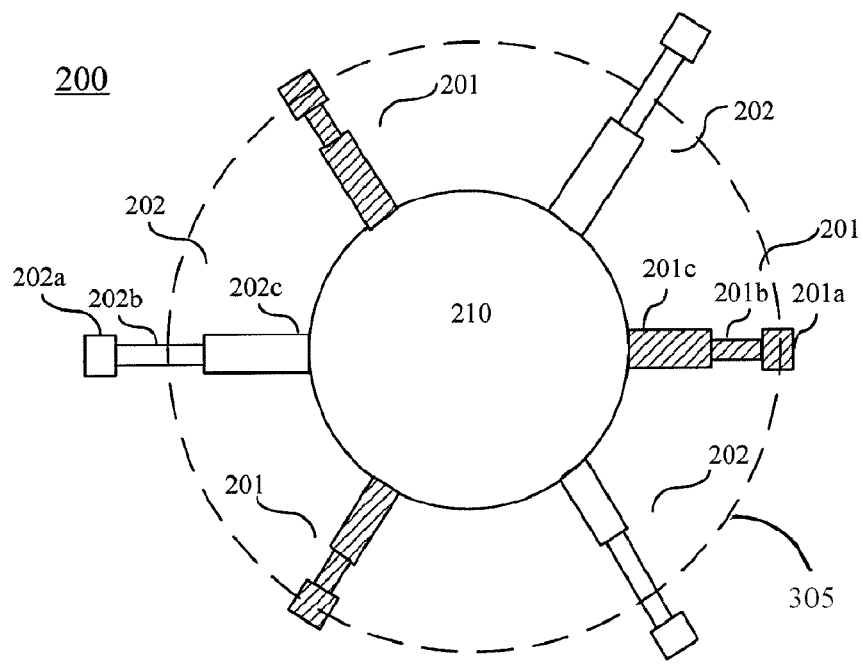
FIG. 4 is a schematic view for illustrating an exemplary operation of the electric-controlled operator of FIG. 2.
Figure 5:
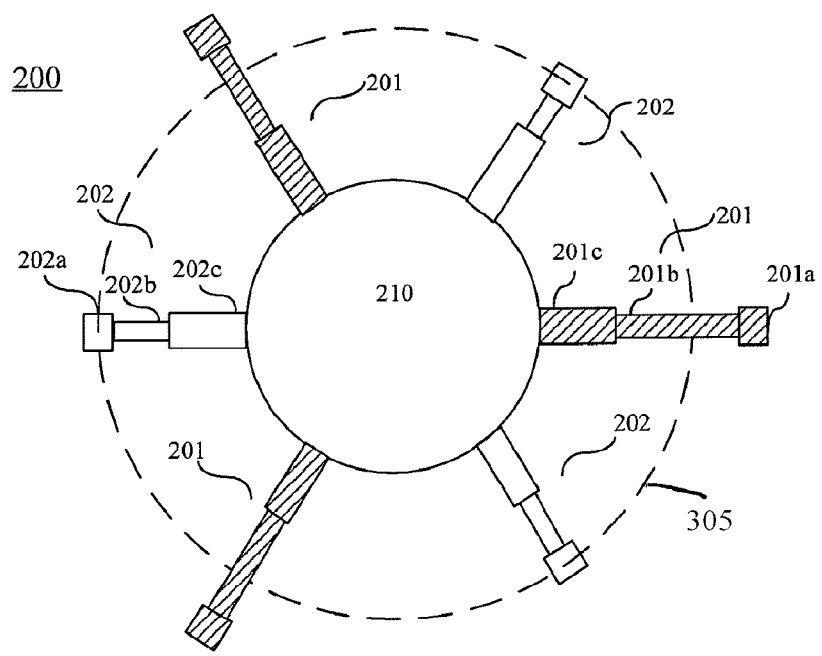
FIG. 5 is a schematic view for illustrating the exemplary operation of the electric-controlled operator of FIG. 2.

FIG. 4 and FIG. 5 are schematic views illustrating an exemplary operation of the electric-controlled operator according to the first embodiment. As shown in FIG. 4 and FIG. 5, each gripper in the first group of grippers 201 has a gripper pin 201$a$, a gripper arm 201$b$ and a cylinder 201$c$. Similarly, each gripper in the second group of grippers 202 has a gripper pin 202$a$, a gripper arm 202$b$ and a cylinder 202$c$. Although FIG. 4 only labels the gripper structure for two grippers, other grippers in the respective group of grippers can have a similar or same structure. According to this exemplary operation, each one of the first group of grippers 201 and the second group of grippers 202 is configured to cooperatively grip the object by refracting and to cooperatively release the object by stretching out.

FIG. 4 shows a state in which the first group of grippers 201 is used to grip the object. In FIG. 4, the gripped object is indicated by a dashed circle 305. As shown in FIG. 4, when using the first group of grippers 201 to grip the object, all grippers in the first group of grippers 201 refract, such that the grippers in the first group of grippers 201 can grip the object by locking the edge of the object with the recesses on the gripper pins 201$a$. On the other end, when using the first group of grippers 201 to grip the object, all the grippers in the second group of grippers 202 are in a releasing state, such that the gripper pins of the grippers in the second group of grippers 202 do not contact the object.

FIG. 5 shows a state in which the second group of grippers 202 is used to grip the object. In FIG. 5, the gripped object is indicated by a dashed circle. As shown in FIG. 5, when using the second group of grippers 202 to grip the object, all grippers in the second group of grippers 202 retract, such that the grippers 202$a$ in the second group of grippers 202 can grip the object by locking the edge of the object with the recesses on the gripper pins 202$a$. On the other end, when using the second group of grippers 202 to grip the object, all the grippers in the first group of grippers 201 are in a releasing state, such that the gripper pins 201$a$ of the grippers in the first group of grippers 201 do not contact the object.

According to this exemplary operation, each of the grippers can be coupled to the base via an associated (corresponding) cylinder, and can include a gripper arm connected to that cylinder. Depending on the position of the gripper arm in the cylinder, the corresponding gripper may be in a retracting state or in a stretching-out state.

Figure 6:
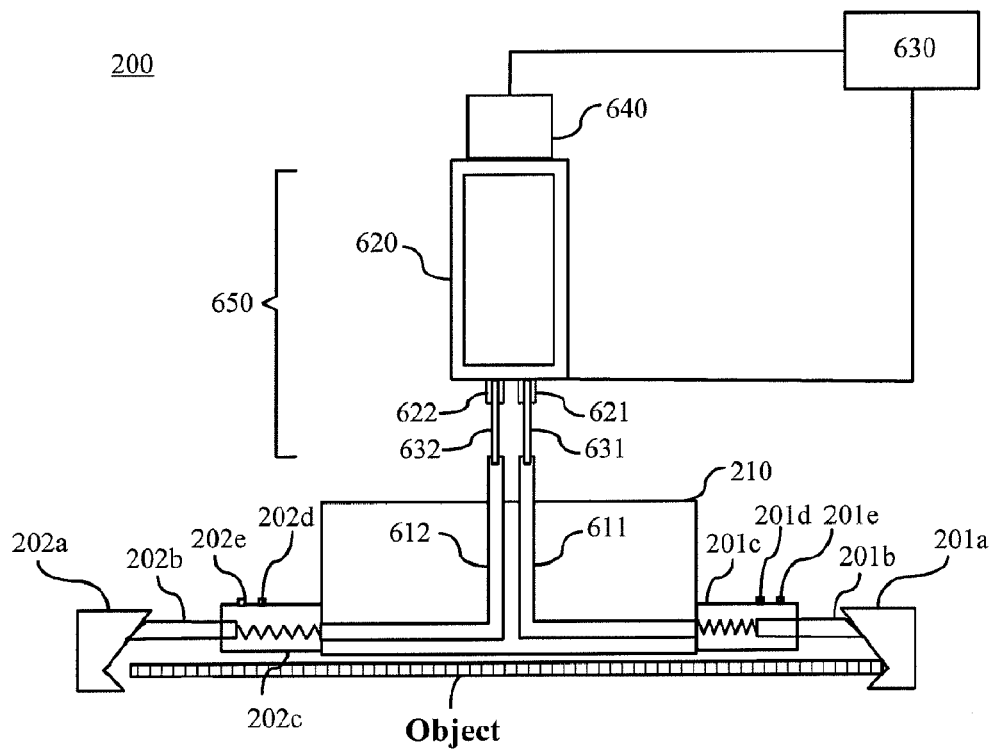
FIG. 6 is a schematic view for illustrating an exemplary drive manner of the electric-controlled operator of FIG. 2.

FIG. 6 illustrates an exemplary drive manner of an electric-controlled operator according to a first embodiment of the present disclosure. It is understood that the drive manner shown in FIG. 6 is merely illustrative. Other drive manners and/or drive means can also be used so long as they can respectively cause the stretching out (for releasing objects) and retracting (for gripping objects) of the first group of grippers 201 and the second group of grippers 202 according to the present disclosure.

As shown in FIG. 6, each gripper in the first group of grippers 201 can include a gripper pin 201$a$, a gripper arm 201$b$ and a cylinder 201$c$, as described above. An elastic member (such as a spring) can be connected between the gripper arm 201$b$ and the base 210, such that the gripper arm 201$b$ can reciprocate in the cylinder 201$c$ (along the left-and-right direction in the figure). The cylinder 201$c$ can communicate with a pipe 611 that is provided within the base and used for the first group of grippers 201. Similarly, each gripper in the second group of grippers 202 can include a gripper pin 202$a$, a gripper arm 202$b$ and a cylinder 202$c$, as described above. An elastic member (such as a spring) can be connected between the gripper arm 202$b$ and the base 210, such that the gripper arm 202$b$ can reciprocate in the cylinder 202$c$ (along the left-and-right direction in the figure). The cylinder 202$c$ can communicate with a pipe 612 that is provided within the base and used for the second group of grippers 202. The pipe 611 communicates with the cylinders 201$c$ of all grippers in the first group of grippers 201 such that the gripper arms 201$b$ can move in a same manner, and the pipe 612 communicates with the cylinders 202$c$ of all grippers in the second group of grippers 202 such that the gripper arms 202$b$ can move in a same manner.

As shown in FIG. 6, the electric-controlled operator 200 may further include a valve 650 and a controller 630. The valve 650 can be configured to control a position of each gripper arm in the cylinder. The pipe 611 and the pipe 612 in the base 210 are connected with the valve. The valve 650 can be a solenoid valve, which can comprise a gas storage element 620, valve gates 622 and 621, as well as a first passage 631 and a second passage 632 respectively interconnected with the valve gates. The first passage 631 is used for controlling the positions of the gripper arms of the grippers of the first group of grippers 201 in the cylinder, and the second passage 632 is used for controlling the positions of the gripper arms of the grippers of the second group of grippers 202 in the cylinder. Specifically, the pipe 611 is connected with the gas storage element 620 of the valve 650 via the valve gate 621 of the valve 650 that is used for controlling the first passage 631, and the pipe 612 is connected with the gas storage element 620 of the valve 650 via the valve gate 622 of the valve 650 that is used for controlling the second passage 632. The controller 630 is configured to control the valve 650 by using a control signal, so as to control the positions of the gripper arms in the cylinder. More specifically, the controller 630 can be configured to control the opening and closing of the valve gates 621 and 622. The controller 630 can be in a wire or wireless communication with the valve 650. The controller 630 can be located in the vicinity of the valve 650 or in a remote location of the valve 650. Commands can be manually input into the controller in real-time, or a command sequence can be stored in the controller in advance such that the controller can automatically work in accordance with the command sequence. According to the drive manner of the present disclosure, the controller 630 can send, to the valve 650, a control signal to open the valve gate 621 and close the valve gate 622, a control signal to close the valve gate 621 and open the valve gate 622, or a control signal to close both the valve gates 621 and 622. More specifically, in a situation where the first group of grippers 201 is to grip the object and the second group of grippers 202 remains in a releasing state, the controller sends out a control signal to close the valve gate 621 and open the valve gate 622. In a situation where the second group of grippers 202 is to grip the object and the first group of grippers 201 remains in a releasing state, the controller sends out a control signal to close the valve gate 622 and open the valve gate 621. In a situation where either one of the first group of grippers 201 and the second group of grippers 202 needs to make the object released or in a situation where the electric-controlled operator is in a non-operating state, the controller sends out a control signal to open both the valve gates 622 and 621. During operation, the valve gate 622 and valve gate 621 are not closed at the same time.

As described above, the valve 650 is adapted to control the positions of the gripper arms 201$b$ and 202$b$ in the cylinders 201$c$ and 202$c$ in accordance with the control signal of the controller.

More specifically, when the controller controls the valve 650 to open the valve gate 621, the first passage 631 is ON, the air pressure in the pipe 611 increases and the cylinder arms 201$b$ stretch out, such that the first group of grippers 201 is in a state of releasing the object. When the controller controls the valve 650 to close the valve gate 621, the first passage 631 is blocked, the air pressure in the pipe 611 decreases and the cylinder arms 201$b$ retract due to the elasticity of the elastic member, such that the gripper of the first group of grippers 201 grip (hold) the object.

Similarly, when the controller controls the valve 650 to open the valve gate 622, the second passage 632 is ON, the air pressure in the pipe 612 increases and the cylinder arms 202$b$ stretch out, such that the second group of grippers 202 is in a state of releasing the object. When the controller controls the valve 650 to close the valve gate 622, the second passage 632 is blocked, the air pressure in the pipe 612 decreases and the cylinder arms 202$b$ retract due to the elasticity of the elastic member, such that the grippers of the second group of grippers 202 grip (hold) the object.

Although a solenoid valve is described above for controlling the stretching out (for releasing the object) and retracting (for gripping the object) of each group of grippers, any other types of valves (e.g. hydraulic valve, pneumatic control valve) can be used so long as they can control the positions of the gripper arms in the cylinder. In addition, although a valve is described above for controlling the stretching out (for releasing the object) and retracting (for gripping the object) of each group of grippers, other well-known means (e.g. motors) can also be used.

According to an exemplary implementation, a gripper arm position sensor can be provided on each of the gripper arms. Each one of the gripper arm position sensors corresponds to one gripper arm, for sensing the position of that gripper arm in the cylinder. The gripper arm position sensor for each gripper in the first group of grippers 201 can include, as shown in FIG. 6, a first position sensor 201$d$ for sensing a first position of the gripper arm and a second position sensor 201$e$ for sensing a second position of the gripper arm. Similarly, the gripper arm position sensor for each gripper in the second group of grippers 202 can include, as shown in FIG. 6, a first position sensor 202$d$ for sensing a first position of the gripper arm and a second position sensor 202$e$ for sensing a second position of the gripper arm. The first position can be a position of the end of the gripper arm (that is connected with the elastic member) when the gripper arm is in a retracting state or a position range around that position (a first position range), and the second position can be a position of the end of the gripper arm (that is connected with the elastic member) when the gripper arm is in a releasing state or a position range around that position (a second position range). The first position sensor can output a sensing signal when it senses that the end of the gripper arm is in the first position (or within the first position range). The second position sensor can output a sensing signal when it senses that the end of the gripper arm is in the second position (or within the second position range).

Although in the example described above with reference to FIG. 6, gripper arm position sensor includes a first position sensor and a second position sensor, it is understood that the gripper arm position sensor may include only one sensor that is used for outputting a signal indicating the position of the gripper arm. The position sensor described herein can be any known position sensor, for example, an optical sensor that detects light blocking by the end of the gripper arm, or a magnetic induction sensor that detects variations of the magnetic field around the gripper arm.

In addition to the grippers, the base having pipes and the valve, the electric-controlled operator 200 can further include gripper arm position indicators (not shown). Each of the gripper arm position indicators can correspond to one gripper arm, for indicating the position of the gripper arm in the cylinder that is sensed by the corresponding gripper arm position sensor. Various existing technologies can be adopted for the gripper arm position indicators, for example, ON and OFF of a light bulb can be used to indicate the position (the first position or the second position) of the gripper arm in the cylinder, or the turning on of light emitting diodes of different colors can be used to represent the position of the gripper arm in the cylinder. The gripper arm position indicator can be integrated together with the gripper arm position sensor.

According to one implementation, the electric-controlled operator 200 can include an alarm device 640. In such situation, the sensing result from the gripper arm position sensors can be transmitted to the controller 630 in a wire or wireless manner. The controller 630 can compare the received sensing result with the sent out control signal. When a position of a gripper arm in the cylinder that is detected by at least one gripper arm position sensor is not consistent with the position of the gripper arm in the cylinder that is indicated by the aforementioned control signal, the controller 630 instructs the alarm device 640 to send out an alarm signal. In one embodiment, after a predetermined time since the control signal is sent out, if there still exists a position of a gripper in the cylinder that is detected by at least one gripper arm position sensor which is inconsistent with the position of the gripper arm in the cylinder that is indicated by the control signal, the alarm device 640 sends out an alarm signal. The predetermined time can be set in advance according to particular applications. For example, the predetermined time can be a time needed by the gripper arm to move from the first position to the second position in response to the change of the air pressure within the cylinder. In addition, preferably, if the position of the gripper arm changes in a situation where the control signal is not sent out, the alarm device 640 sends out an alarm signal.

The alarm device 640 can be a sound generator that can produce an alarm sound, or a light bulb or a light emitting diode that can emit light of alarm colors. Although the alarm device 640 is shown to be located in the vicinity of the valve 650, the alarm device 640 can also be located in the vicinity of the controller 630. With the gripper arm position sensors, the gripper arm position indicators and/or the alarm device, an operator can intuitively be aware of the position of each gripper arm, and can immediately know whether the operation of the electric-controlled operator is inconsistent with the control signal.

The electric-controlled operator 200 according to an embodiment of the present invention as well as its exemplary operation and drive manner is described above with reference to FIGS. 2-6. Although each one of the first group of grippers 201 and the second group of grippers 202 has been shown in FIG. 2 with three grippers, the present invention is not so limited. Each one of the first group of grippers 201 and the second group of grippers 202 may have more than three grippers. Although FIG. 2 shows a configuration of the electric-controlled operator 200 that is suitable for putting in/taking out circular objects (e.g. wafers), the present invention is not so limited. The shape of the base 210 and the arrangement of each gripper can be designed depending on the shape of the object to be put in and taken out.

Figure 7:
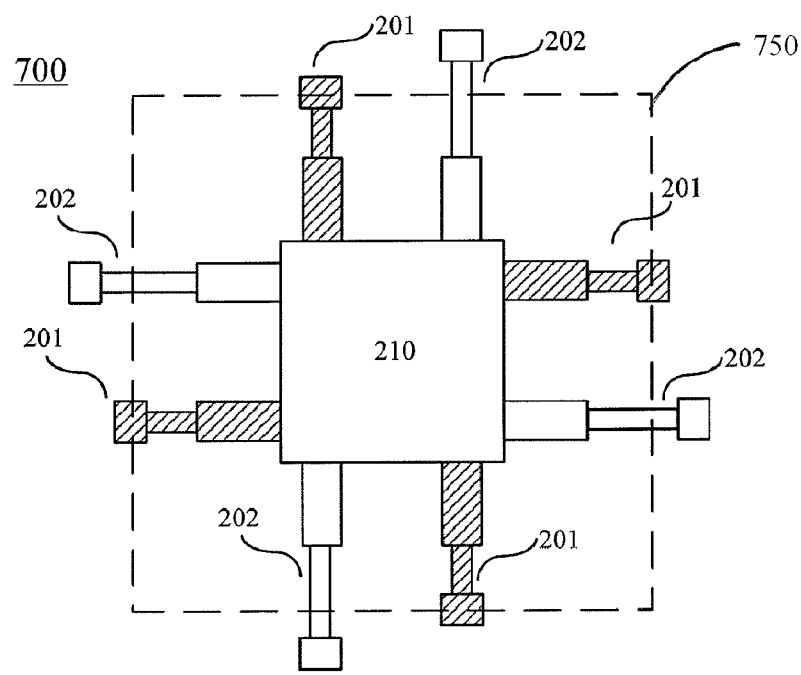
FIG. 7 is a schematic view showing an electric-controlled operator according to another embodiment of the present disclosure.

FIG. 7 is a schematic view showing an electric-controlled operator 700 according to another embodiment of the present disclosure. In this embodiment, the object 750 to be put in and taken out has a square shape (as indicated by the dashed rectangular block in FIG. 7), and thus the base 210 is also in a square shape, and each one of the first group of grippers 201 and the second group of grippers 202 can include four grippers. At each edge of the square base 210, there is provided one of the grippers in the first group of grippers 201 and one of the grippers in the second group of grippers 202, as shown in FIG. 7. FIG. 7 shows a state in which the first group of grippers 201 is gripping the object.

Except for the shape of the base and the arrangement of the grippers, the electric-controlled operator 700, shown in FIG. 7, is similar to electric-controlled operator 200, shown in FIG. 2 in terms of the structure of the grippers, the operation of the groups of grippers as well as the drive manner of the electric-controlled operator.

Figure 8:
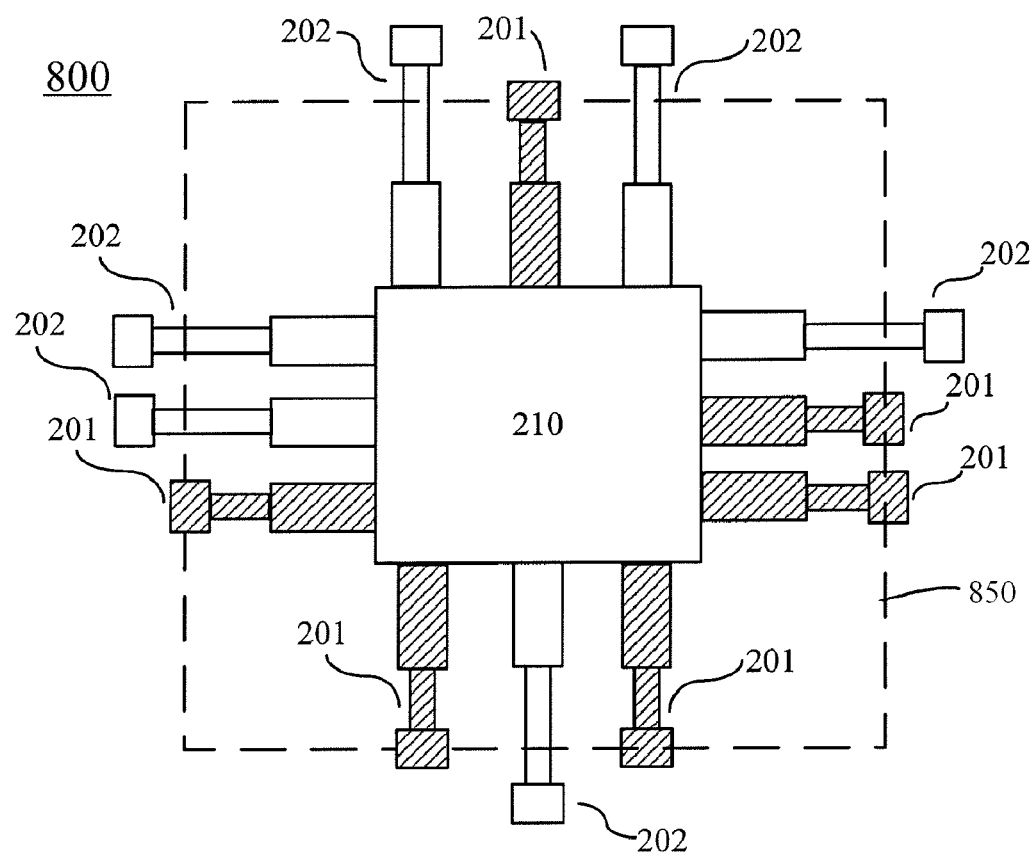
FIG. 8 is a schematic view showing an electric-controlled operator according to another embodiment of the present disclosure.

FIG. 8 is a schematic view showing an electric-controlled operator 800 according to another embodiment of the present disclosure. In this embodiment, the object 850 to be put in and taken out has a rectangular shape (as indicated by the dashed rectangular block in FIG. 8), and the base 210 is also in a rectangular shape. Each one of the first group of grippers 201 and the second group of grippers 202 can include six grippers arranged as shown in FIG. 8. FIG. 8 shows a state when the first group of grippers 201 is gripping the object.

Except for the shape of the base and the arrangement of the grippers, the electric-controlled operator 800 is similar to electric-controlled operator 200 in terms of the structure of the grippers, the operation of the groups of grippers as well as the drive manner of the electric-controlled operator.

According to the electric-controlled operator of the present invention, since both the groups of grippers grip the object (i.e. put in and take out the object) from the same surface side of the base, putting in and taking out of the object are performed at a same surface side of the base for each process chamber, thus preventing the base from turning (reversing) and avoiding frequent replacements of parts.

Further, according to some embodiments of the present invention, on the base of the electric-controlled operator, a minimum number of 6 grippers can be used (instead of 12 grippers used in prior art systems as shown in FIG. 1*a*). As a result, the cost of parts can be saved.

It is understood that although some figures show states when the electric-controlled operator grips the object or releases the object, the object is not a part of the electric-controlled operator of various embodiments of the present invention.

Although some specific embodiments of the present invention have been demonstrated in detail with examples, it should be understood by a person skilled in the art that the above examples are only intended to be illustrative but not to limit the scope of the present invention. It should be understood by a person skilled in the art that the above embodiments can be modified without departing from the scope and spirit of the present invention. The scope of the present invention is defined by the attached claims.

What is claimed is:

1. An electric-controlled operator comprising:
   a base;
   a first group of grippers coupled to the base, the first group of grippers comprising at least three grippers adapted to cooperatively grip an object and cooperatively release the object before the object is processed and a second group of grippers coupled to the base, the second group of grippers comprising at least three grippers adapted to cooperatively grip the object and cooperatively release the object after the object is processed, wherein each gripper in the first and the second group of grippers is coupled to the base via an associated cylinder, each gripper including an associated gripper arm connected to the associated cylinder, and a position of a gripper arm in the cylinder determines whether its associated gripper is in a retracted state or an extended state;
   a valve adapted to control the positions of the gripper arm in their associated cylinders;
   a controller adapted to control the valve using a control signal; and
   a plurality of position sensors each being associated with and adapted to sense the positions of a different one of gripper arms in the gripper arm's associated cylinder,
   wherein the first group of grippers and the second group of grippers are controlled individually such that when one of the first group of grippers and the second group of grippers cooperatively grips the object, the other one is in a state in which the object is released, the first group of grippers and the second group of grippers being adapted to grip the object from a same surface side of the base, and each one of the first group of grippers and the second group of grippers is adapted to cooperatively grip the object by retracting and to cooperatively release the object by stretching.

2. The electric-controlled operator according to claim 1, wherein the grippers in the first group of grippers and the second group of grippers are alternately arranged on the base.

3. The electric-controlled operator according to claim 2, wherein the base has a circular shape, and
   wherein each of the first and second group of grippers comprises three grippers with each gripper extending along a radial direction of the base, and
   wherein the object is a wafer.

4. The electric-controlled operator according to claim 1, wherein adjacent grippers in the first group of grippers form a first equal angle, and adjacent grippers in the second group of grippers form a second equal angle.

5. The electric-controlled operator according to claim 1, wherein each gripper is coupled to the base via an elastic member.

6. The electric-controlled operator according to claim 1, wherein the valve has a first passage and a second passage, the first passage controlling the positions of the gripper arms of the first group of grippers in their associated cylinders, and the second passage controlling the positions of the gripper arms of the second group of grippers in their associated cylinders.

7. The electric-controlled operator according to claim 1, wherein the valve is a solenoid valve.

8. The electric-controlled operator according to claim 1, wherein each one of the grippers includes a gripper pin having a recess facing the base.

9. The electric-controlled operator according to claim 1, further comprising:
an alarm device adapted to transmit an alarm signal when a position of a gripper arm in the cylinder sensed by its associated position sensor is determined not to be consistent with an expected position of the gripper arm in the cylinder as set by the control signal.

10. The electric-controlled operator according to claim 1, wherein the base has a circular shape, and
wherein each of the first and second group of grippers comprises three grippers with each gripper extending along a radial direction of the base, and
wherein the object is a wafer.

11. The electric-controlled operator according to claim 1, wherein the base has a circular shape and wherein each of the first and second group of grippers comprises three grippers with each gripper extending along a radial direction of the base, wherein the object is a wafer.

* * * * *